US012622019B2

(12) United States Patent
Wang et al.

(10) Patent No.: US 12,622,019 B2
(45) Date of Patent: May 5, 2026

(54) FIELD EFFECT TRANSISTOR AND METHOD FOR MANUFACTURING SAME, AND DISPLAY PANEL

(71) Applicant: BOE Technology Group Co., Ltd., Beijing (CN)

(72) Inventors: Dongfang Wang, Beijing (CN); Jie Huang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/920,351

(22) PCT Filed: Nov. 26, 2021

(86) PCT No.: PCT/CN2021/133706
§ 371 (c)(1),
(2) Date: Oct. 20, 2022

(87) PCT Pub. No.: WO2023/092501
PCT Pub. Date: Jun. 1, 2023

(65) Prior Publication Data
US 2024/0213373 A1       Jun. 27, 2024

(51) Int. Cl.
*H10B 43/27*          (2023.01)
*G11C 11/408*         (2006.01)
(Continued)

(52) U.S. Cl.
CPC ....... *H10D 30/6755* (2025.01); *H10D 30/023* (2025.01); *H10D 30/031* (2025.01); *H10D 30/6733* (2025.01); *H10D 64/514* (2025.01)

(58) Field of Classification Search
CPC ............. H10D 30/031; H10D 30/6704; H10D 30/6755; H10D 30/6723;
(Continued)

(56) References Cited

U.S. PATENT DOCUMENTS 12,009,432 B2 * 6/2024 Kunitake ........... H10D 30/6755
2012/0286270 A1 * 11/2012 Isobe ..................... H10D 86/01
                                                    438/156
(Continued)

FOREIGN PATENT DOCUMENTS

CN          105140271 B  *  3/2019  ....... H01L 21/02565
CN          113054036 A  *  8/2021  ......... H01L 27/1225

*Primary Examiner* — Wael M Fahmy
*Assistant Examiner* — Aneesa Riaz Baig
(74) *Attorney, Agent, or Firm* — IPro, PLLC

(57)          ABSTRACT

The present disclosure provides a field effect transistor and a method for manufacturing the same, and a display panel, relating to the field of display technologies. The field effect transistor includes a substrate, an active layer, a source, a drain, a first insulating layer and an oxygenating layer. An orthographic projection of the oxygenating layer on the substrate is overlapped with an orthographic projection of a target region of the active layer on the substrate. Therefore, when the oxygenating layer is prepared, oxygen elements in the process environment can diffuse to the target region of the active layer, to oxygenate the active layer. In this way, oxygen vacancies in the active layer can be reduced, and the uniformity and stability of the active layer is improved, thereby further improving the performance of the field effect transistor.

16 Claims, 7 Drawing Sheets

(51) Int. Cl.

| | |
|---|---|
| *G11C 11/412* | (2006.01) |
| *G11C 11/418* | (2006.01) |
| *H01L 21/768* | (2006.01) |
| *H01L 23/48* | (2006.01) |
| *H01L 25/00* | (2006.01) |
| *H01L 25/065* | (2023.01) |
| *H10B 41/27* | (2023.01) |
| *H10B 41/30* | (2023.01) |
| *H10B 41/35* | (2023.01) |
| *H10B 43/30* | (2023.01) |
| *H10B 43/35* | (2023.01) |
| *H10D 30/01* | (2025.01) |
| *H10D 30/67* | (2025.01) |
| *H10D 64/27* | (2025.01) |

(58) Field of Classification Search
CPC ... H10D 30/673–6736; H10D 30/6739; H10D 30/875; H10D 30/6731; H10D 30/6734; H10D 64/514; H10D 30/6758
See application file for complete search history.

(56) References Cited

U.S. PATENT DOCUMENTS

| | | | | |
|---|---|---|---|---|
| 2013/0137213 A1* | 5/2013 | Egi | ..................... | H10D 62/405 |
| | | | | 438/104 |
| 2018/0248043 A1* | 8/2018 | Asami | ................... | H10D 87/00 |
| 2019/0237584 A1* | 8/2019 | Asami | ............... | H10D 30/6757 |
| 2020/0411693 A1* | 12/2020 | Yamazaki | ............ | H10D 64/517 |
| 2021/0202755 A1* | 7/2021 | Ok | ................... | H01L 21/02483 |
| 2024/0213373 A1* | 6/2024 | Wang | .................. | H10D 64/514 |

\* cited by examiner

10

104    106

1051—105

103

1021—102

101

10

104    108

106

1051—105

107

103

1021—102

101

10

10

FIELD EFFECT TRANSISTOR AND METHOD FOR MANUFACTURING SAME, AND DISPLAY PANEL

CROSS-REFERENCE TO RELATED APPLICATION

This present disclosure is a U.S. national stage of international application No. PCT/CN2021/133706, filed on Nov. 26, 2021, the disclosure of which is herein incorporated by reference in its entirety.

TECHNICAL FIELD

The present disclosure relates to the field of display technologies, and in particular, relates to a field effect transistor and a method for manufacturing the same, and a display panel.

BACKGROUND

Currently, indium gallium zinc oxide (IGZO) is widely used for preparing an active layer of a field effect transistor (FET) due to its high mobility, good uniformity, good transparency and the like.

SUMMARY

Embodiments of the present disclosure provide a field effect transistor and a method for manufacturing the same, and a display panel. The technical solutions are as follows.

According to some embodiments of the present disclosure, a field effect transistor is provided. The field effect transistor includes:

a substrate;

an active layer disposed on a side of the substrate;

a source and a drain disposed on a side of the active layer away from the substrate;

a first insulating layer disposed on a side, away from the substrate, of the source and the drain, wherein the first insulating layer is provided with an opening region, the active layer includes a target region in the opening region, and the target region is between the source and the drain;

an oxygenating layer disposed on a side of the first insulating layer away from the substrate, wherein an orthographic projection of the oxygenating layer on the substrate is overlapped with an orthographic projection of the target region of the active layer on the substrate.

In some embodiments, the orthographic projection of the target region of the active layer on the substrate is within the orthographic projection of the oxygenating layer on the substrate.

In some embodiments, the field effect transistor further includes:

a first gate insulating layer disposed between the oxygenating layer and the first insulating layer, wherein an orthographic projection of the first gate insulating layer on the substrate is overlapped with an orthographic projection of opening region on the substrate; and a first gate disposed on a side of the first gate insulating layer away from the substrate.

In some embodiments, the oxygenating layer and the first gate insulating layer are an integral structure.

In some embodiments, a material of the oxygenating layer includes: at least one of indium gallium zinc oxide, indium tin oxide, indium gallium tin oxide, indium zinc oxide, aluminum oxide, copper oxide, silicon oxide, hafnium oxide, zirconium oxide, and tantalum oxide.

In some embodiments, a material of the first gate insulating layer includes at least one of silicon oxide and aluminum oxide.

In some embodiments, the material of the oxygenating layer and the material of the first gate insulating layer are both silicon oxide, and a ratio of an etching rate of the oxygenating layer to an etching rate of the first gate insulating layer ranges from 1.2 to 1.5 when the oxygenating layer and the first gate insulating layer are etched with a hydrogen fluoride solution.

In some embodiments, the material of the oxygenating layer and the material of the first gate insulating layer are both aluminum oxide, and a ratio of an etching rate of the oxygenating layer to an etching rate of the first gate insulating layer ranges from 1 to 1.6 when the oxygenating layer and the first gate insulating layer are etched with a hydrogen fluoride solution.

In some embodiments, a thickness of the oxygenating layer ranges from 5 nm to 50 nm.

According to some embodiments of the present disclosure, a method for manufacturing a field effect transistor is provided. The method includes:

forming an active layer and a source-drain electrode in sequence on a substrate;

forming a first insulating layer on the substrate on which the source-drain electrode is formed, wherein the first insulating layer is provided an opening region, and the active layer includes a target region in the opening region; and forming an oxygenating layer on the substrate on which the first insulating layer is formed, wherein an orthographic projection of the oxygenating layer on the substrate is overlapped with an orthographic projection of the target region of the active layer on the substrate.

In some embodiments, forming the oxygenating layer on the substrate on which the first insulating layer is formed includes:

in an environment with an oxygen concentration greater than or equal to 20%, forming the oxygenating layer on the substrate on which the first insulating layer is formed by a preset process.

In some embodiments, forming the oxygenating layer on the substrate on which the first insulating layer is formed includes:

in an environment with an oxygen concentration greater than or equal to 20%, forming the oxygenating layer on the substrate on which the first insulating layer is formed with an insulating material by a preset process, wherein the oxygenating layer is reused as a first gate insulating layer; and after forming the oxygenating layer on the substrate on which the first insulating layer is formed, the method further includes:

forming a first gate on the substrate on which the oxygenating layer is formed.

In some embodiments, the preset process is a sputtering deposition process or an atomic layer deposition process.

According to some embodiments of the present disclosure, a display panel is provided. The display panel includes: a substrate, and a plurality of field effect transistors described in the above aspect. The plurality of field effect transistors are disposed on the substrate.

BRIEF DESCRIPTION OF THE DRAWINGS

For clearer descriptions of the technical solutions in the embodiments of the present disclosure, the following briefly describes the accompanying drawings required for describing the embodiments. Apparently, the accompanying drawings in the following description show merely some embodiments of the present disclosure, and those of ordinary skill in the art may still derive other drawings from these accompanying drawings without creative efforts.

Figure 1:
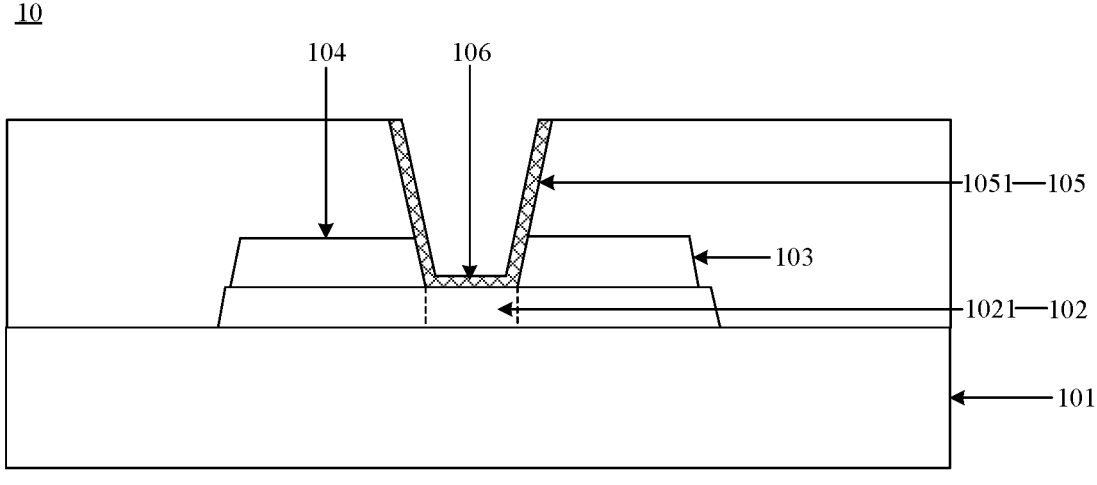
FIG. 1 is a schematic structural diagram of a field effect transistor according to some embodiments of the present disclosure.

Specific embodiments of the present disclosure have been shown through the foregoing drawings and will be described in more detail hereinafter. These drawings and written descriptions are not intended to limit the scope of the concepts of the present disclosure in any way, but to illustrate the concepts of the present disclosure to those skilled in the art by referring to the specific embodiments.

DETAILED DESCRIPTION

To make the objectives, technical solutions, and advantages of the present disclosure clearer, the present disclosure will be further described in detail below with reference to the accompanying drawings.

In some practices, a field effect transistor includes an active layer, a source, a drain, a gate, a gate insulating layer and a passivation layer. Field effect transistors work under the condition of a very small current and a very low voltage, and many field effect transistors are easily integrated on one silicon wafer by the manufacturing process thereof. Therefore, field effect transistors are widely used in large-scale integrated circuits.

With the increasingly high requirement on the pixel density (pixels per inch, short for PPI) of products related to augmented reality (AR) technology and virtual reality (VR) technology, the PPI of ultra-high PPI products has risen from 6000 PPI to over 10000 PPI, which makes the requirements on the size and off-state current (Ioff) of the field effect transistors become higher and higher. The higher the PPI is, the higher density at which the device is capable of displaying images.

Since the active layer in the field effect transistor includes a metal oxide semiconductor layer, and there are many oxygen vacancies in the oxide semiconductor layer in the practices, the conductivity of the oxide semiconductor layer becomes higher. As a result, the length of the channel of the oxide semiconductor layer is shortened, and short channel effects easily occur in the field effect transistors with a smaller size.

In addition, the large number of oxygen vacancies in the oxide semiconductor layer also results in negative bias of the threshold voltage of the field effect transistor, thereby resulting in positive bias temperature instability (PBTI) of the field effect transistor. The PBTI refers to the properties that the oxide semiconductor layer remains stable with the extension of time of being applied with the bias voltage under the action of the positive bias voltage and temperature. As a result, the performance of the field effect transistor is poor.

Some and all of the above technical problems are solved by the following limited embodiments of the present disclosure.

The field effect transistor provided in the embodiments of the present disclosure is used in the display field or chip field, and the display field includes the fields of liquid crystal displays (LCD), organic light-emitting diode (OLED) display panels, quantum dot light emitting diodes (QLED) display panels, micro light emitting diode (Micro LED) display panels, sensing technologies and the like. The field effect transistor provided in the embodiments of the present disclosure is used in a display region or a region of a gate driver on array (GOA) circuit.

FIG. 1 is a schematic structural diagram of a field effect transistor provided according to some embodiments of the present disclosure. Referring to FIG. 1, the field effect transistor 10 includes a substrate 101, an active layer 102, a source 103, and a drain 104, a first insulating layer 105 and an oxygenating layer 106.

The active layer 102 is disposed on a side of the substrate 101, the source 103 and the drain 104 are disposed on the side of the active layer 102 away from the substrate 101, and the first insulating layer 105 is disposed on the side, away from the substrate 101, of the source 103 and the drain 104, and the oxygenating layer 106 is disposed on the side of the first insulating layer 105 away from the substrate 101.

Referring to FIG. 1, the source 103 and the drain 104 are disposed in the same layer and are prepared by the same patterning process. The source 103 and the drain 104 are both electrically connected to the active layer 102. The active layer 102 includes a metal oxide semiconductor layer.

The first insulating layer 105 is provided with an opening region 1051. The active layer 102 includes a target region 1021 in the opening region 1051, and the target region 1021 is between the source 103 and the drain 104. A slot is formed in the opening region 1051, and the target region 1021 is exposed from the slot. The active layer 102 includes a channel layer, and the orthographic projection of the target region 1021 on the substrate 101 is within the orthographic projection of the channel layer on the substrate 101.

The orthographic projection of the oxygenating layer 106 on the substrate 101 is overlapped with the orthographic projection of the target region 1021 of the active layer 102 on the substrate 101. For example, the region, under the source 103 and the drain 104, of the active layer 102 is a first region, and the region, between the source 103 and the drain 104, of the active layer 102 is a second region. The second region includes the target region 1021.

In the embodiments of the present disclosure, the oxygenating layer 106 is disposed on the side of the active layer 102 away from the substrate 101, that is, the oxygenating layer 106 is prepared before the active layer 102, and the orthographic projection of the oxygenating layer 106 on the substrate 101 is overlapped with the orthographic projection of the target region 1021 of the active layer 102 on the substrate 101. Therefore, when the oxygenating layer 106 is prepared, oxygen elements in the environment diffuse to the target region 1021 of the active layer 102, and the oxygen vacancies in the active layer 102 is reduced, so that the short channel effect of the active layer 102 is suppressed to a large extent, and the PBTI of the field effect transistor is effectively improved. Thus, the uniformity and stability of the active layer 102 is effectively improved, and the off-state current of the field effect transistor 10 is reduced so as to reduce the leakage current.

It should be noted that each film layer of the field effect transistor 10 is prepared in a reaction chamber. For example, oxygen is injected into the reaction chamber when the oxygenating layer 106 is prepared, so that the oxygen concentration in the reaction chamber is greater than or equal to 20%.

In summary, the present disclosure provides a field effect transistor. The field effect transistor includes a substrate, an active layer, a source, a drain, a first insulating layer and an oxygenating layer. The orthographic projection of the oxygenating layer on the substrate is overlapped with the orthographic projection of the target region of the active layer on the substrate.

Therefore, when the oxygenating layer is prepared, the oxygen elements in the process environment diffuse to the target region of the active layer, to oxygenate the active layer. Thus, the oxygen vacancies in the active layer are reduced, and the uniformity and stability of the active layer is improved, thereby further improving the performance of the field effect transistor.

Optionally, the first insulating layer 105 includes a first insulating sub-layer and a second insulating sub-layer laminated in sequence along a direction away from the substrate 101. The first insulating sub-layer is made of silicon nitride (SiNx), and the second insulating sub-layer is made of silicon oxide (SiOx). The thickness of the first insulating layer 105 ranges from 200 nm (nanometers) to 400 nm, and the thickness of the second insulating sub-layer is greater than or equal to 100 nm.

The material of the active layer 102 includes a semiconductor of one or more metal oxides. For example, the material of the active layer 102 includes at least one of indium gallium zinc oxide (IGZO), indium tin oxide (ITO) and indium zinc oxide (IZO). The thickness of the active layer 102 ranges from 5 nm to 50 nm.

Optionally, as shown in FIG. 1, the orthographic projection of the target region 1021 of the active layer 102 on the substrate 101 is within the orthographic projection of the oxygenating layer 106 on the substrate 101. That is, the orthographic projection of the oxygenating layer 106 on the substrate 101 covers the orthographic projection of the target region 1021 on the substrate 101. In this way, more oxygen elements in the environment where the oxygenating layer 106 is prepared diffuse to the target region 1021 of the active layer 102, and the oxygen vacancies in the active layer 102 are reduced, which suppresses the short channel effect of the active layer 102 to a great extent. Thus, the uniformity and stability of the field effect transistor 10 are further improved.

Figure 2:
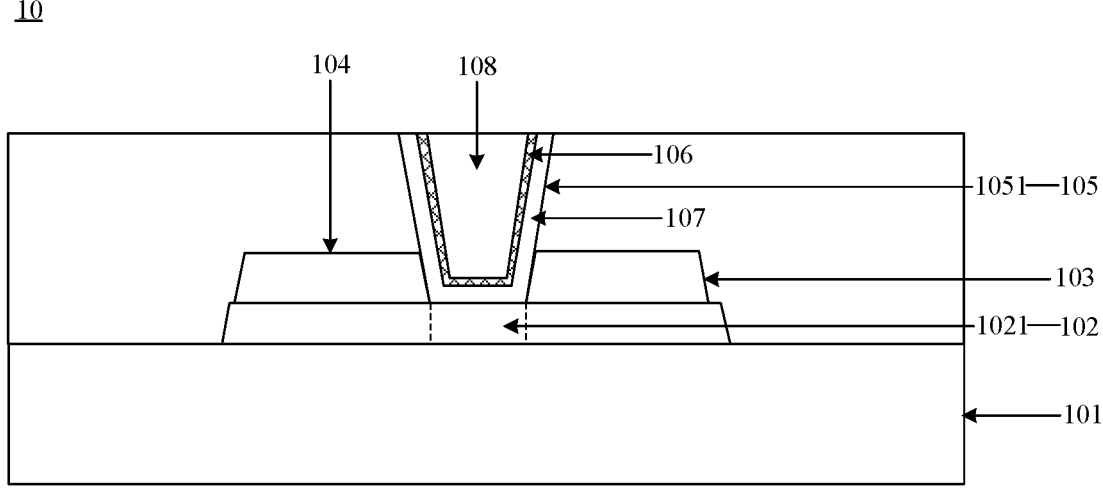
FIG. 2 is a schematic structural diagram of another field effect transistor according to some embodiments of the present disclosure.

Optionally, FIG. 2 is a schematic structural diagram of another field effect transistor according to some embodiments of the present disclosure. As shown in FIG. 2, the field effect transistor 10 further includes a first gate insulating (GI) layer 107 disposed between the oxygenating layer 106 and the first insulating layer 105, and a first gate 108 disposed on the side of the first gate insulating layer 107 away from the substrate 101. The first gate 108 is made of a metal material. For example, the material of the first gate 108 includes pure metal or a metal alloy. The material of the first gate 108 includes at least one of molybdenum (Mo), tungsten (W) and titanium (Ti). The thickness of the first gate 108 ranges from 5 nm to 200 nm.

The orthographic projection of the first gate insulating layer 107 on the substrate 101 is overlapped with the orthographic projection of the opening region 1051 of the first insulating layer 105 on the substrate 101. The first gate insulating layer 107 is disposed in the opening region 1051 of the first insulating layer 105 and is in contact with the opening region 1051 of the first insulating layer 105, and the first gate insulating layer 107 is in contact with both a side face of the source 103 and a side face of the drain 104.

The side of the first gate insulating layer 107 close to the substrate 101 is in contact with the active layer 102.

In an optional implementation, a slope angle of the first gate 108 ranges from 70 degrees to 90 degrees. The slope angle is an angle between the side wall of the first gate 108 and a plane where the substrate 101 is disposed.

Furthermore, the slope angle of the first gate 108 is 90 degrees. In this case, the orthographic projection of the first gate 108 on the substrate 101 is not overlapped with the orthographic projections of the source 103 and the drain 104 on the substrate 101. In this way, the parasitic capacitance between the first gate 108 and the source 103, and the parasitic capacitance between the first gate 108 the drain 104 is smaller, which improves the stability of the field effect transistor 10.

The first gate insulating layer 107 is configured to insulate the first gate 108 from the active layer 102, and insulate the first gate 108 from the source 103 and the drain 104 at the same time. In other words, the first gate insulating layer 107 is configured to insulate the oxygenating layer 106 from the active layer 102, and insulate the oxygenating layer 106 from the source 103 and the drain 104 at the same time.

Figure 3:
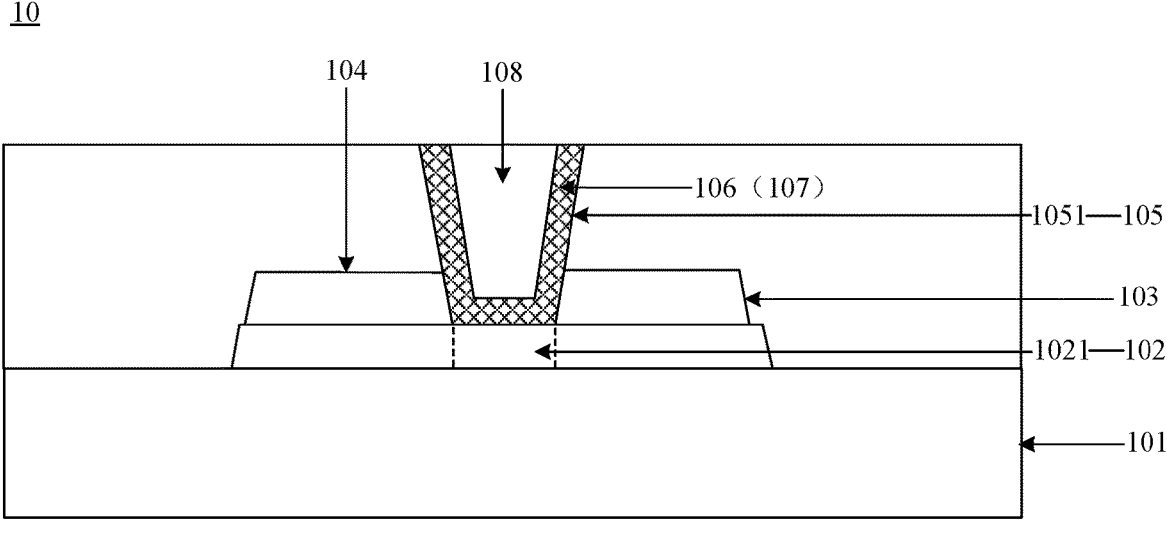
FIG. 3 is a schematic structural diagram of another field effect transistor according to some embodiments of the present disclosure.

Optionally, FIG. 3 is a schematic structural diagram of another field effect transistor according to some embodiments of the present disclosure. As shown in FIG. 3, the oxygenating layer 106 and the first gate insulating layer 107 are an integral structure. That is, in the process of preparing the oxygenating layer 106, oxygen is injected into the reaction chamber by using an insulating material, so that the oxygen concentration in the reaction chamber is greater than or equal to 20%. Therefore, the oxygen elements in the environment diffuse to the target region 1021 of the active layer 102, and the oxygen vacancies in the active layer 102 are reduced, so that the short channel effect of the active layer 102 is suppressed to a large extent, and the PBTI of the field effect transistor is effectively improved. Thus, the uniformity and stability of the active layer 102 are improved. In this way, there is no need to separately manufacture the first gate insulating layer 107 and the oxygenating layer 106, and the oxygenating layer 106 is reused as the first gate insulating layer 107, which simplifies the manufacturing steps of the field effect transistor.

Optionally, the material of the oxygenating layer 106 includes at least one of indium gallium zinc oxide (IGZO), indium tin oxide (ITO), indium gallium tin oxide (IGTO), indium zinc oxide (IZO), aluminum oxide (AlOx), copper oxide (CuO), silicon oxide (SiOx), hafnium oxide (HfOx), zirconium oxide (ZrOx), tantalum oxide (TaOx), and the like. The thickness of the oxygenating layer 106 ranges from 5 nm to 50 nm. The oxygenating layer 106 is formed by a sputtering deposition process or an atomic layer deposition (ALD) process. For example, the metal oxide film for preparing the oxygenating layer 106 is formed by a sputtering deposition process in which the oxygen concentration in the reaction chamber is greater than or equal to 20%. During the process of depositing the metal oxide film in a high oxygen environment, oxygen is excited into oxygen plasma, and a large amount of oxygen ions diffuse to the target region 1021 of the active layer 102 to achieve the effect of oxygenating active layer 102 and reducing the amount of oxygen vacancies in the active layer 102. The metal oxide film formed of the metal oxide material by the sputtering deposition process in a high oxygen environment has a certain conductivity, and its conductivity is related to the metal oxide material itself, the oxygen ratio in the sputtering deposition process environment, and the like. Therefore, before the oxygenating layer 106 including the metal oxide material is prepared, the first gate insulating layer 107 needs to be prepared in the field effect transistor 10, to insulate the oxygenating layer 106 from the active layer 102 and insulate the oxygenating layer 106 from the source 103 and the drain 104.

Alternatively, the material of the oxygenating layer 106 includes a material with good insulative properties, such as aluminum oxide (AlOx) or silicon oxide (SiOx). As such, the oxygenating layer 106 also insulates the first gate 108 from the active layer 102, and insulates the first gate 108 from the source 103 and the drain 104.

Optionally, the material of the first gate insulating layer 107 includes at least one of silicon oxide (SiOx) and aluminum oxide (AlOx). The first gate insulating layer 107 is a multi-layered structure, and the thickness thereof ranges from 10 nm to 80 nm. For example, the first gate insulating layer 107 includes a first gate insulating sub-layer and a second gate insulating sub-layer. The material of the first gate insulating sub-layer includes aluminum oxide, and the material of the second gate insulating sub-layer includes silicon oxide.

The first gate insulating layer 107 is formed by a sputtering deposition process, a chemical vapor deposition (CVD) process or an atomic layer deposition (ALD) process.

Optionally, as shown in FIG. 2, the material of the oxygenating layer 106 and the material of the first gate insulating layer 107 are both silicon oxide. When the oxygenating layer 106 and the first gate insulating layer 107 are etched with a hydrogen fluoride solution, the ratio of the etching rate of the oxygenating layer 106 to the etching rate of the first gate insulating layer 107 ranges from 1.2 to 1.5. Since the preparation conditions of the oxygenating layer 106 and the first gate insulating layer 107 are different, the oxygenating layer 106 and the first gate insulating layer 107 have different film qualities. Generally, the film quality of the first gate insulating layer 107 is better than the film quality of the oxygenating layer 106.

In the embodiments of the present disclosure, the film qualities of the oxygenating layer 106 and the first gate insulating layer 107 is characterized by the etching rates of the oxygenating layer 106 and the first gate insulating layer 107 when they are etched with the hydrogen fluoride (HF) solution. The slower the etching rate, the better the film qualities of the oxygenating layer 106 and the first gate insulating layer 107.

Optionally, the material of the oxygenating layer 106 and the material of the first gate insulating layer 107 are both aluminum oxide. When the oxygenating layer 106 and the first gate insulating layer 107 are etched with a hydrogen fluoride solution, the ratio of the etching rate of the oxygenating layer 106 to the etching rate of the first gate insulating layer 107 ranges from 1 to 1.6. Similarly, when the material of the oxygenating layer 106 and the material of the first gate insulating layer 107 are both aluminum oxide, the oxygenating layer 106 and the first gate insulating layer 107 are distinguished by the etching rates of the oxygenating layer 106 and the first gate insulating layer 107 when they are etched with the hydrogen fluoride solution.

Figure 4:
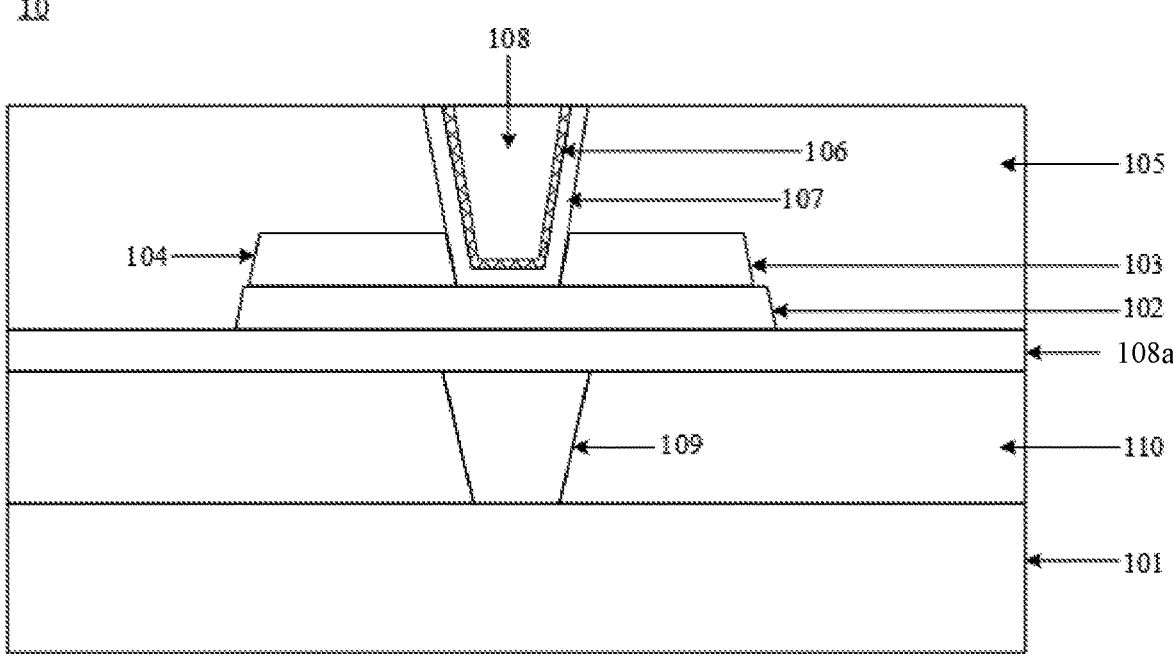
FIG. 4 is a schematic structural diagram of another field effect transistor according to some embodiments of the present disclosure.

Optionally, FIG. 4 is a schematic structural diagram of another field effect transistor according to some embodiments of the present disclosure. As shown in FIG. 4, the field effect transistor 10 further includes a second gate insulating layer 108a disposed on the side of the active layer 102 close to the substrate 101, and a second gate 109 and a second insulating layer 110 which are disposed on the side of the second gate insulating layer 108a close to the substrate 101. The second insulating layer 110 is provided with an opening region, and the second gate 109 is disposed in the opening region of the second insulating layer 110. The second insulating layer 110 is referred to as a buffer layer. The second gate 109 further improves the performance of the field effect transistor 10.

In summary, the present disclosure provides a field effect transistor. The field effect transistor includes a substrate, an active layer, a source, a drain, a first insulating layer and an oxygenating layer. The orthographic projection of the oxygenating layer on the substrate is overlapped with the orthographic projection of the target region of the active layer on the substrate. Therefore, when the oxygenating layer is prepared, the oxygen elements in the process environment diffuse to the target region of the active layer, to oxygenate the active layer. In this way, the oxygen vacancies in the active layer are reduced, and the uniformity and stability of the active layer is improved, thereby further improving the performance of the field effect transistor.

Figure 5:
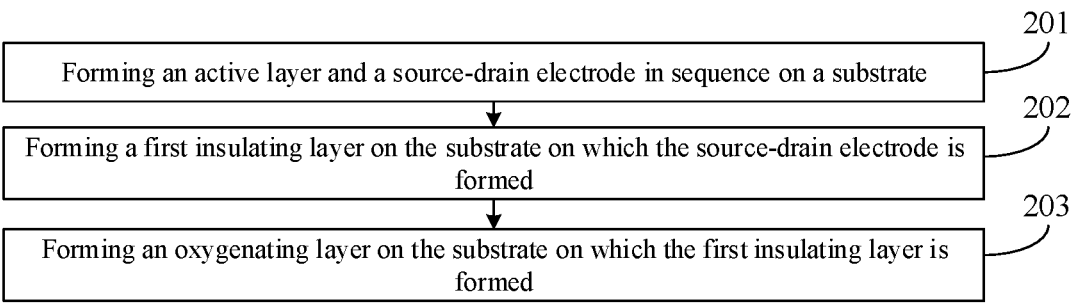
FIG. 5 is a flowchart of a method for manufacturing a field effect transistor according to some embodiments of the present disclosure.

FIG. 5 is a flowchart of a method for manufacturing a field effect transistor according to some embodiments of the present disclosure. The method is used to manufacture the field effect transistor provided in the above embodiments, for example, the field effect transistor shown in FIG. 1. Referring to FIG. 5, the method includes the following steps.

In step 201, an active layer and a source-drain electrode are formed in sequence on a substrate.

The source-drain electrode includes a source and a drain.

In step 202, a first insulating layer is formed on the substrate on which the source-drain electrode is formed.

The first insulating layer is provided with an opening region, and the active layer includes a target region in the opening region.

In step 203, an oxygenating layer is formed on the substrate on which the first insulating layer is formed.

The orthographic projection of the oxygenating layer on the substrate is overlapped with the orthographic projection of the target region of the active layer on the substrate.

Since the active layer 102 has a relatively high mobility, many oxygen vacancies are present in the active layer 102 of the field effect transistor, and it is difficult to control the characteristics of the field effect transistor. In the embodiments of the present disclosure, the oxygenating layer 106 is disposed on the side of the active layer 102 away from the substrate 101, that is, the oxygenating 106 is prepared before the active layer 102, and the orthographic projection of the oxygenating layer 106 on the substrate 101 is overlapped with the orthographic projection of the target region 1021 of the active layer 102 on the substrate 101. Therefore, when the oxygenating layer 106 is prepared, oxygen elements in the environment diffuse to the target region 1021 of the active layer 102, and the oxygen vacancies in the active layer 102 are reduced, so that the short channel effect of the active layer 102 is suppressed to a large extent, and the PBTI of the field effect transistor is effectively improved. Thus, the uniformity and stability of the active layer 102 are effectively improved, and the off-state current of the field effect transistor 10 is reduced so as to reduce the leakage current.

Figure 6:
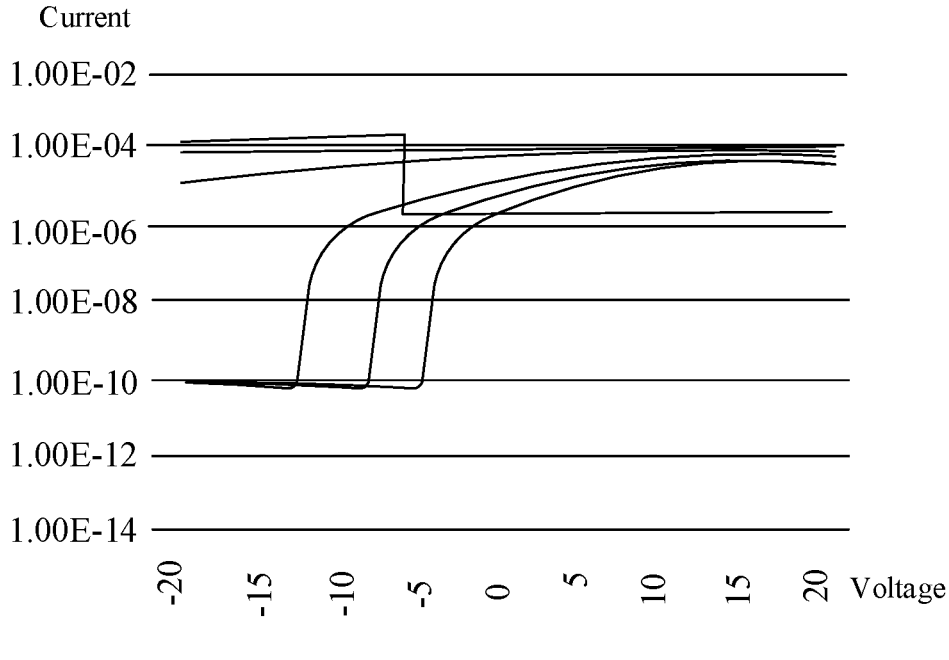
FIG. 6 is a schematic diagram showing switching characteristics of a field effect transistor in the related art.
Figures 7, 8:
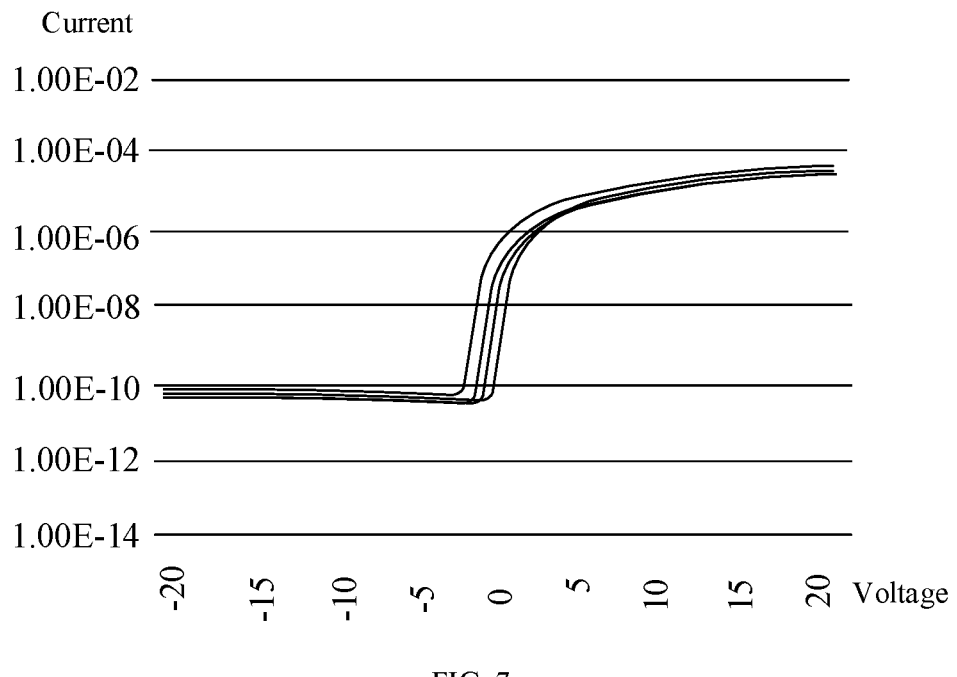
FIG. 7 is a schematic diagram showing switching characteristics of a field effect transistor according to some embodiments of the present disclosure.
FIG. 8 is a schematic diagram showing a test result of an off-state current of a monocrystalline silicon field effect transistor in the related art.

FIG. 6 is a schematic diagram showing switching characteristics of a field effect transistor in the related art, and FIG. 7 is a schematic diagram showing switching characteristics of a field effect transistor according to some embodiments of the present disclosure. Referring to FIG. 6 and FIG. 7, the abscissa represents voltage, in unit of volt (V), and the ordinate represents current, in unit of ampere (A). The multiple curves in FIG. 6 and FIG. 7 show the change of the drain current of the field effect transistor with the gate voltage in the related art or in the embodiments of the present disclosure.

As shown in FIG. 6, in the related art, many oxygen vacancies are present in the active layer. When the field effect transistor is in the off state, currents with a certain strength are present in various regions of the active layer, and the currents in different regions are greatly different (For example, the ordinates of each curve in the figure represent the currents of a region at different voltages). As a result, the difference between the current in the on state and the current in the off state of the field effect transistor is small, and the switching characteristics of the field effect transistor are poor.

As shown in FIG. 7, few oxygen vacancies are present in the active layer in the embodiments of the present disclosure. When the field effect transistor is in the off state, the currents in various regions of the active layer are small; and when the field effect transistor is in the on state, the currents in the various regions of the active layer gradually increase and tend to be stable. Therefore, the difference between the current in the on state and the current in the off state of the field effect transistor is large, and the difference between currents in the various regions under the same voltage is small, and the switching characteristics of the field effect transistor are good.

Figure 9:
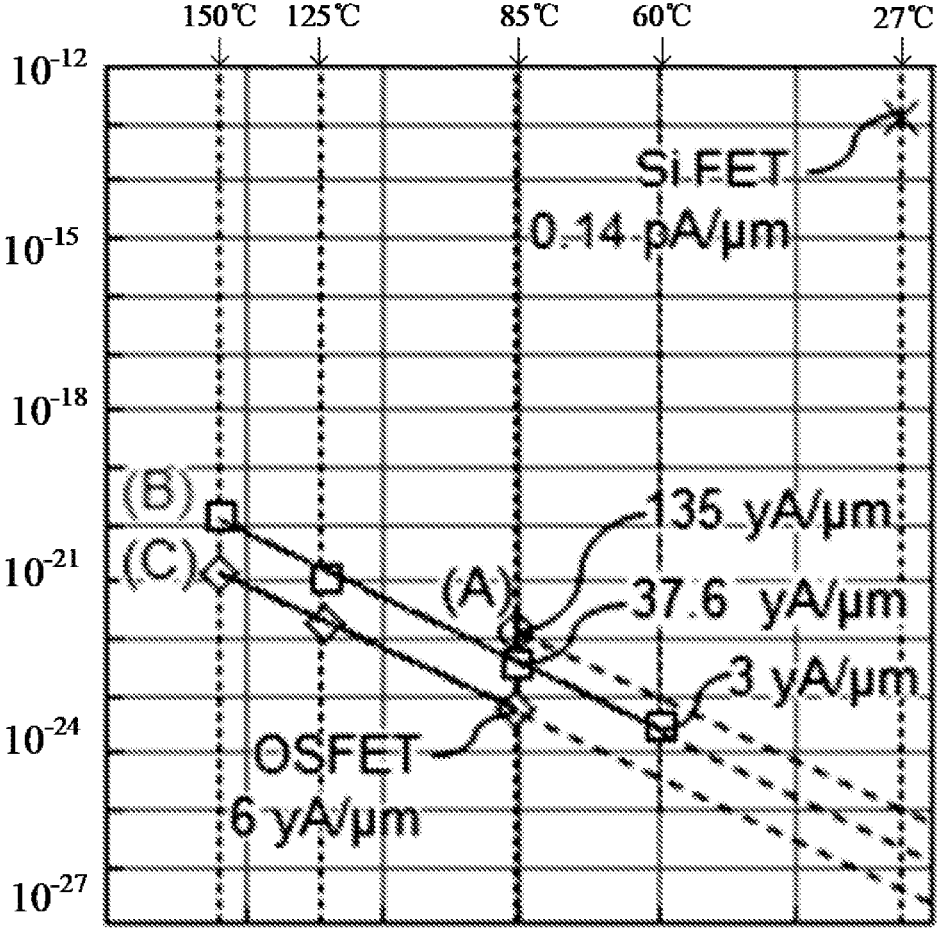
FIG. 9 is a schematic diagram showing a test result of an off-state current of a field effect transistor according to some embodiments of the present disclosure.

FIG. 8 is a schematic diagram showing a test result of an off-state current of a monocrystalline silicon field effect transistor in the related art, FIG. 9 is a schematic diagram showing a test result of an off-state current of a field effect transistor according to some embodiments of the present disclosure. Referring to FIG. 8 and FIG. 9, the abscissa in FIG. 8 represents voltage, in unit of volt (V), and the ordinate represents current, in unit of ampere (A). The abscissa in FIG. 9 represents temperature, in unit of degree Celsius (° C.), the ordinate represents current, in unit of ampere (A), and A/μm represents the value of the leakage current per unit length. It can be seen from FIG. 8 and FIG. 9 that the value of the off-state current of the monocrystalline silicon field effect transistor in the related art is about 1e-15A, and the value of the off-state current of the field effect transistor in the embodiments of the present disclosure at 1500 C is about 1e-19A. In the plurality of field effect transistors tested in the embodiments of the present disclosure, the value of the leakage current per unit length of one metal oxide field effect transistor (OSFET, line segment C in the figure represents the test result of the field effect transistor) at 85° C. is about 6 yA/μm, and the value of the leakage current value per unit length of another field effect transistor (line segment B in the figure represents the test result of the field effect transistor) at 85° C. is about 37.6 yA/μm, while the value of the leakage current per unit length of the monocrystalline silicon field effect transistor (SiFET) in the related art at 27° C. is about 0.14 pA/μm. Here, y represents $10^{-24}$ and p represents $10^{-12}$.

In summary, the present disclosure provides a method for manufacturing a field effect transistor. The field effect transistor manufactured according to this method includes a substrate, an active layer, a source, a drain, a first insulating layer and an oxygenating layer. The orthographic projection of the oxygenating layer on the substrate is overlapped with the orthographic projection of the target region of the active layer on the substrate. Therefore, when the oxygenating layer is prepared, the oxygen elements in the process environment diffuse to the target region of the active layer, to oxygenate the active layer. Thus, the oxygen vacancies in the active layer are reduced, and the uniformity and stability of the active layer is improved, thereby further improving the performance of the field effect transistor.

Figure 10:
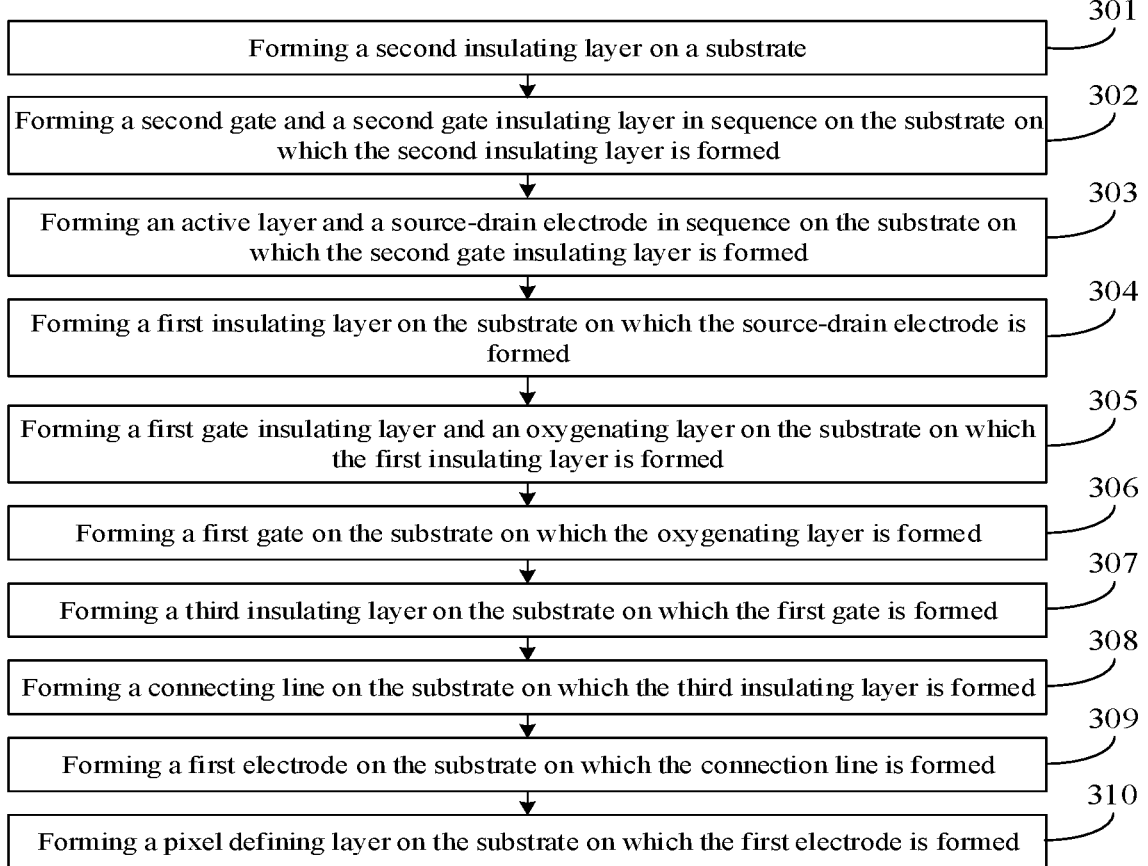
FIG. 10 is a flowchart of a method for manufacturing a display panel according to some embodiments of the present disclosure.

FIG. 10 is a flowchart of a method for manufacturing a display panel according to some embodiments of the present disclosure. The display panel includes the field effect transistor in any of the above embodiments, and this method is used to manufacture the display panel including the field effect transistor provided in the above embodiments, for example, the display panel including the field effect transistor shown in FIG. 1, FIG. 2, FIG. 3 or FIG. 4. Referring to FIG. 10, the method includes the following steps.

In step 301, a second insulating layer is formed on a substrate.

After the substrate is cleaned by a standard method, a plasma enhanced chemical vapor deposition (PECVD) process is adopted to deposit a first insulating film on the substrate. The first insulating film includes silicon oxide. Then, the first insulating film is patterned to form a second insulating layer. The substrate 101 is a glass substrate. Referring to FIG. 4, the second insulating layer 110 is referred to as a buffer layer, and is disposed on a side of the substrate 101.

In step 302, a second gate and a second gate insulating layer are formed in sequence on the substrate on which the second insulating layer is formed.

First, a first gate metal film is formed on the substrate on which the second insulating layer is formed by a sputtering deposition process or an ALD process, and then the first gate metal film is patterned to acquire the second gate. The thickness of the second gate ranges from 50 nm to 300 nm, and the material of the second gate includes at least one of metals such as molybdenum (Mo), titanium (Ti), and tungsten (W).

Second, a second gate insulating layer is formed on the substrate on which the second insulating layer is formed by a sputtering deposition process, a CVD process or an ALD process. The second gate insulating layer is a laminated structure with a thickness from 10 nm to 80 nm, and the material of the second gate insulating layer includes at least one of silicon oxide or aluminum oxide.

Referring to FIG. 4, the second insulating layer 110 is provided with an opening region, and the second gate 109 is disposed in the opening region of the second insulating layer 110. The second gate insulating layer 108a is disposed on the side of the second gate 109 away from the substrate 101.

In step 303, an active layer and a source-drain electrode are formed in sequence on the substrate on which the second gate insulating layer is formed.

First, a metal oxide film is formed on the substrate on which the second gate insulating layer is formed by a sputtering deposition process or an ALD process. The material of the metal oxide film includes at least one of indium gallium zinc oxide (IGZO), indium tin oxide (ITO) and indium zinc oxide (IZO). Then, the metal oxide film is patterned to form the active layer. The thickness of the active layer ranges from 5 nm to 50 nm.

Second, a source-drain metal film is formed on the substrate on which the active layer is formed by a sputtering deposition process or an ALD process. The thickness of the source-drain metal film ranges from 50 nm to 300 nm, and the material thereof includes at least one of metals such as molybdenum (Mo), titanium (Ti) and tungsten (W). Then, the source-drain metal film is patterned to form a source-drain metal layer.

Referring to FIG. 4, the source-drain electrode is disposed on the side of the active layer 102 away from the substrate 101, and the source-drain electrode includes a source 103 and a drain 104. The side, close to the edge of the substrate 101, of the source 103 and the drain 104 is formed together with the active layer 102 by a one-time patterning process, which simplifies the manufacturing process of the field effect transistor.

Alternatively, the source, the drain and the active layer are formed by a halftone mask process.

In step 304, a first insulating layer is formed on the substrate on which the source-drain electrode is formed.

A second insulating film is formed on the substrate on which the source-drain electrode is formed by a PECVD process or an ALD process. The thickness of the second insulating film ranges from 200 nm to 400 nm, and the material thereof includes at least one of silicon oxide and silicon nitride. The second insulating film is patterned to acquire the first insulating layer. The first insulating layer is a laminated structure.

Referring to FIG. 3, the first insulating layer 105 is provided with an opening region 1051, and the active layer 102 includes a target region 1021 in the opening region 1051. The side, away from the edge of the substrate 101, of the source 103 and the drain 104 is formed together with the first insulating layer 105 by a one-time patterning process, which simplifies the manufacturing process of the field effect transistor.

In step 305, a first gate insulating layer and an oxygenating layer are formed on the substrate on which the first insulating layer is formed.

The orthographic projection of the oxygenating layer on the substrate is overlapped with the orthographic projection of the target region of the active layer on the substrate.

In the embodiments of the present disclosure, the process of forming the oxygenating layer includes the following two methods.

Method I:

(1) The first gate insulating layer is formed on the substrate on which the first insulating layer is formed by a sputtering deposition process, a CVD process or an ALD process. The first gate insulating layer is a laminated structure, with a thickness of 10 nm to 80 nm. The material of the first gate insulating layer includes at least one of aluminum oxide (AlOx) and silicon oxide (SiOx).

(2) In an environment with an oxygen concentration greater than or equal to 20%, the oxygenating layer is formed on the substrate on which the first gate insulating layer is formed by a preset process.

The preset process includes a sputtering deposition process or an ALD process. The material of the oxygenating layer includes at least one of indium gallium zinc oxide (IGZO), indium tin oxide (ITO), indium gallium tin oxide (IGTO), indium zinc oxide (IZO), aluminum oxide (AlOx), copper oxide (CuO), and silicon oxide (SiOx). The thickness of the oxygenating layer ranges from 5 nm to 50 nm.

Referring to FIG. 4, the first gate insulating layer 107 is disposed between the oxygenating layer 106 and the active layer 102.

Method II: in an environment with the oxygen concentration greater than or equal to 20%, the oxygenating layer is formed with an insulating material on the substrate on which the first insulating layer is formed by a preset process, and the oxygenating layer is reused as the first gate insulating layer. The preset process includes a sputtering deposition process or an ALD process. The material of the oxygenating layer includes at least one of aluminum oxide (AlOx) and silicon oxide (SiOx).

Referring to FIG. 3, the oxygenating layer 106 and the first gate insulating layer 107 are an integral structure.

In step 306, a first gate is formed on the substrate on which the oxygenating layer is formed.

A second gate metal film is formed on the substrate on which the oxygenating layer is formed by a sputtering deposition process or an ALD process, and the second gate metal film is patterned to acquire the first gate. The thickness of the first gate ranges from 5 nm to 200 nm, and the material of the first gate includes at least one of metals such as molybdenum (Mo), titanium (Ti), and tungsten (W).

Referring to FIG. 3, the oxygenating layer 106, the first gate insulating layer 107 and the first gate 108 are all disposed in the opening region 1051 of the first insulating layer 105, and the oxygenating layer 106, the first gate insulating layer 107 and the first gate 108 are formed by a one-time patterning process.

In step 307, a third insulating layer is formed on the substrate on which the first gate is formed.

A third insulating film is formed on the substrate on which the first gate is formed by a PECVD process. The thickness of the third insulating film ranges from 200 nm to 400 nm, and the material of the third insulating film includes at least one of silicon oxide and silicon nitride. The third insulating film is patterned to acquire the third insulating layer. The third insulating layer is a laminated structure and is used as a passivation layer.

In step 308, a connecting line is formed on the substrate on which the third insulating layer is formed.

The first insulating layer and the third insulating layer are provided with a first via hole therein, and the first via hole exposes the drain, so that the first electrode is electrically connected to the drain via the first via hole.

A connecting line with a thickness of 200 nm to 1200 nm is formed by a sputtering deposition process. The material of the connecting line includes a molybdenum-niobium alloy (MoNb) and copper (Cu), or a molybdenum-nickel-titanium alloy (MTD) and copper, or a combination of MoNb, copper, MTD, and the like. The patterning process for forming the connection line includes photoetching.

In step 309, a first electrode is formed on the substrate on which the connection line is formed.

An indium tin oxide (ITO) film with a thickness of 40 nm to 135 nm or a laminated film of indium tin oxide (ITO), argentum (Ag) and indium tin oxide (ITO) with a thickness of 40 nm to 135 nm is prepared by a sputtering deposition process, and then is photoetched to form the first electrode.

In step 310, a pixel defining layer is formed on the substrate on which the first electrode is formed.

An oxide film with a thickness of 100 nm to 400 nm is deposited by a sputtering deposition process, a CVD process or an ALD process. The material of the oxide film includes at least one of silicon oxide and aluminum oxide, and the oxide film is laminated structure. Then, the oxide film is patterned to form the pixel defining layer.

summary, the present disclosure provides a method for manufacturing a display panel. The field effect transistor in the display panel manufactured according to this method includes a substrate, an active layer, a source, a drain, a first insulating layer and an oxygenating layer. The orthographic projection of the oxygenating layer on the substrate is overlapped with the orthographic projection of the target region of the active layer on the substrate. Therefore, when the oxygenating layer is prepared, the oxygen elements in the process environment diffuse to the target region of the active layer, to oxygenate the active layer. In this way, the oxygen vacancies in the active layer are reduced, and the uniformity and stability of the active layer is improved, thereby further improving the performance of the field effect transistor.

Figure 11:
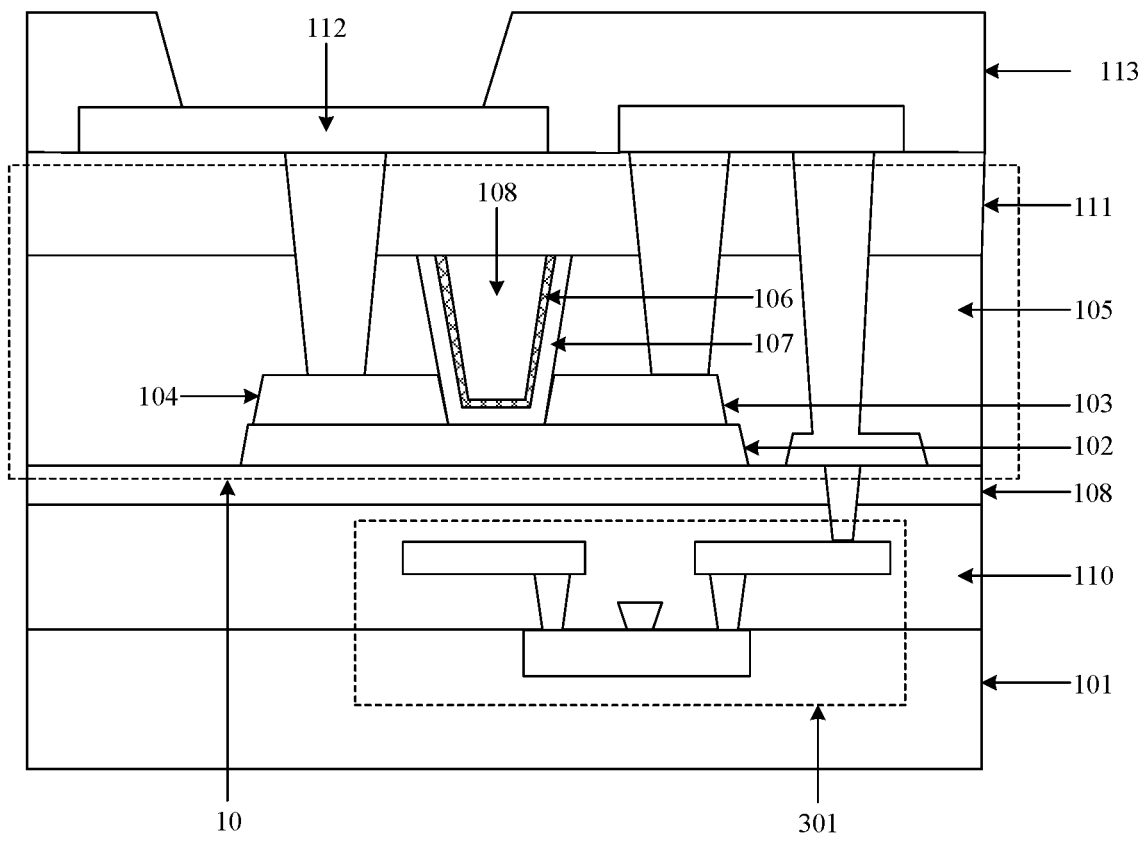
FIG. 11 is a schematic structural diagram of a display panel according to some embodiments of the present disclosure.

FIG. 11 is a schematic structural diagram of a display panel according to some embodiments of the present disclosure. As shown in FIG. 11, the display panel includes a substrate 101, and a plurality of field effect transistors 10 as described in the above embodiments. The plurality of field effect transistors 10 are disposed on the substrate 101.

The display panel 30 further includes a third insulating layer 111 and a first electrode 112.

The third insulating layer 111 includes a passivation layer (PVX) or a planarization layer (PLN).

The third insulating layer 111 is configured to protect the first gate 108. The first electrode 112 is an anode of a light-emitting unit in the display panel.

A pixel defining layer (PDL) 113 is further provided on the side of the first electrode 112 away from the substrate 101. The pixel defining layer 113 is provided with a pixel opening, and a light-emitting material is provided in the pixel opening. A second electrode is provided on the side of the light-emitting material away from the substrate 101. The second electrode is the cathode of the light-emitting unit, and the cathode is a whole-layer structure.

The first insulating layer 105 and the third insulating layer 111 are provided with a first via hole therein, and the first via hole exposes the drain 104, so that the first electrode 112 is electrically connected to the drain 104 via the first via hole.

The display panel 30 further includes a monocrystalline silicon field effect transistor 301.

In this disclosure, the term "at least one of A and B" only describes an association relationship between associated objects, indicating three kinds of relationships. For example, at least one of A and B indicates that A exists alone, A and B exist concurrently, and B exists alone.

Similarly, "at least one of A, B, and C" indicates seven kinds of relationships, which can be expressed as: A exists, alone B exists alone, C exists alone, A and B exist concurrently, A and C exist concurrently, C and B exist concurrently, and A, B and C exist concurrently. Similarly, "at least one of A, B, C, and D" indicates fifteen kinds of relationships, which can be expressed as: A exists alone, B exists alone, C exists alone, D exists alone, A and B exist concurrently, A and C exist, A and D exist concurrently, C and B exist concurrently, D and B exist concurrently, C and D exist concurrently, A, B, and C exist concurrently, A, B, and D exist concurrently, A, C and D exist concurrently, B, C, and D exist concurrently, and A, B, C, and D exist concurrently.

It should be noted that, in the drawings, the sizes of layers and regions may be exaggerated for clarity of illustration. It is to be understood that when an element or layer is referred to as being "on" another element or layer, the element or layer may be directly on the other element or an intervening layer may exist. In addition, it is to be understood that when an element or layer is referred to as being "under" another element or layer, the element or layer may be directly under the other element, or more than one intervening layer or element may exist. In addition, it is to be further understood that when a layer or element is referred to as being "between" two layers or elements, the element or layer may be the only layer between the two layers or elements, or more than one intervening layer or element may exist. Similar reference numerals indicate similar elements throughout.

In this disclosure, the terms "first", "second" and "third" are merely used for descriptive purposes and should not be construed as indicating or implying relative importance. The term "a plurality of" refers to two or more, unless expressly specified otherwise.

The foregoing descriptions are merely optional embodiments of the present disclosure and are not intended to limit the present disclosure. Any modifications, equivalent replacements, improvements and the like within the spirit and principles of the present disclosure shall be included within the protection scope of the present disclosure.

What is claimed is:

1. A field effect transistor, comprising:
   a substrate;
   an active layer disposed on a side of the substrate;
   a source and a drain disposed on a side of the active layer away from the substrate;
   a first insulating layer disposed on a side, away from the substrate, of the source and the drain, wherein the first insulating layer is provided with an opening region, the active layer comprises a target region in the opening region, and the target region is between the source and the drain; and
   an oxygenating layer disposed on a side of the first insulating layer away from the substrate, wherein an orthographic projection of the oxygenating layer on the substrate is overlapped with an orthographic projection of the target region of the active layer on the substrate, wherein the field effect transistor further comprises:
   a first gate insulating layer disposed between the oxygenating layer and the first insulating layer, wherein an orthographic projection of the first gate insulating layer on the substrate is overlapped with an orthographic projection of opening region on the substrate; and
   a first gate disposed on a side of the first gate insulating layer away from the substrate,
   wherein the oxygenating layer and the first gate insulating layer are an integral structure.

2. The field effect transistor according to claim 1, wherein the orthographic projection of the target region of the active layer on the substrate is within the orthographic projection of the oxygenating layer on the substrate.

3. The field effect transistor according to claim 1, wherein a material of the oxygenating layer comprises: at least one of indium gallium zinc oxide, indium tin oxide, indium gallium tin oxide, indium zinc oxide, aluminum oxide, copper oxide, silicon oxide, hafnium oxide, zirconium oxide, and tantalum oxide.

4. The field effect transistor according to claim 1, wherein a material of the first gate insulating layer comprises at least one of silicon oxide and aluminum oxide.

5. The field effect transistor according to claim 4, wherein the material of the oxygenating layer and the material of the first gate insulating layer are both silicon oxide, and a ratio of an etching rate of the oxygenating layer to an etching rate of the first gate insulating layer ranges from 1.2 to 1.5 when the oxygenating layer and the first gate insulating layer are etched with a hydrogen fluoride solution.

6. The field effect transistor according to claim 4, wherein the material of the oxygenating layer and the material of the first gate insulating layer are both aluminum oxide, and a ratio of an etching rate of the oxygenating layer to an etching rate of the first gate insulating layer ranges from 1 to 1.6 when the oxygenating layer and the first gate insulating layer are etched with a hydrogen fluoride solution.

7. The field effect transistor according to claim 1, wherein a thickness of the oxygenating layer ranges from 5 nm to 50 nm.

8. A method for manufacturing a field effect transistor, comprising:

forming an active layer and a source-drain electrode in sequence on a substrate;

forming a first insulating layer on the substrate on which the source-drain electrode is formed, wherein the first insulating layer is provided an opening region, and the active layer comprises a target region in the opening region; and forming an oxygenating layer on the substrate on which the first insulating layer is formed, wherein an orthographic projection of the oxygenating layer on the substrate is overlapped with an orthographic projection of the target region of the active layer on the substrate, wherein the field effect transistor comprises:

a substrate;

an active layer disposed on a side of the substrate;

a source and a drain disposed on a side of the active layer away from the substrate;

a first insulating layer disposed on a side, away from the substrate, of the source and the drain, wherein the first insulating layer is provided with an opening region, the active layer comprises a target region in the opening region, and the target region is between the source and the drain; and an oxygenating layer disposed on a side of the first insulating layer away from the substrate, wherein an orthographic projection of the oxygenating layer on the substrate is overlapped with an orthographic projection of the target region of the active layer on the substrate, wherein the field effect transistor further comprises:

a first gate insulating layer disposed between the oxygenating layer and the first insulating layer, wherein an orthographic projection of the first gate insulating layer on the substrate is overlapped with an orthographic projection of opening region on the substrate; and a first gate disposed on a side of the first gate insulating layer away from the substrate, wherein the oxygenating layer and the first gate insulating layer are an integral structure.

9. The method according to claim 8, wherein forming the oxygenating layer on the substrate on which the first insulating layer is formed comprises:

in an environment with an oxygen concentration greater than or equal to 20%, forming the oxygenating layer on the substrate on which the first insulating layer is formed by a preset process.

10. The method according to claim 8, wherein forming the oxygenating layer on the substrate on which the first insulating layer is formed comprises:

in an environment with an oxygen concentration greater than or equal to 20%, forming the oxygenating layer on the substrate on which the first insulating layer is formed with an insulating material by a preset process, wherein the oxygenating layer is reused as a first gate insulating layer; and after forming the oxygenating layer on the substrate on which the first insulating layer is formed, the method further comprises:

forming a first gate on the substrate on which the oxygenating layer is formed.

11. The method according to claim 9, wherein the preset process is a sputtering deposition process or an atomic layer deposition process.

12. A display panel, comprising: a substrate, and a plurality of field effect transistors disposed on the substrate, and each of the field effect transistors comprises:

a substrate;

an active layer disposed on a side of the substrate;

a source and a drain disposed on a side of the active layer away from the substrate;

a first insulating layer disposed on a side, away from the substrate, of the source and the drain, wherein the first insulating layer is provided with an opening region, the active layer comprises a target region in the opening region, and the target region is between the source and the drain; and an oxygenating layer disposed on a side of the first insulating layer away from the substrate, wherein an orthographic projection of the oxygenating layer on the substrate is overlapped with an orthographic projection of the target region of the active layer on the substrate, wherein the field effect transistor further comprises:

a first gate insulating layer disposed between the oxygenating layer and the first insulating layer, wherein an orthographic projection of the first gate insulating layer on the substrate is overlapped with an orthographic projection of opening region on the substrate; and a first gate disposed on a side of the first gate insulating layer away from the substrate, wherein the oxygenating layer and the first gate insulating layer are an integral structure.

13. The display panel according to claim 12, wherein the orthographic projection of the target region of the active layer on the substrate is within the orthographic projection of the oxygenating layer on the substrate.

14. The display panel according to claim 12, wherein a material of the oxygenating layer comprises: at least one of indium gallium zinc oxide, indium tin oxide, indium gallium tin oxide, indium zinc oxide, aluminum oxide, copper oxide, silicon oxide, hafnium oxide, zirconium oxide, and tantalum oxide.

15. The display panel according to claim 12, wherein a material of the first gate insulating layer comprises at least one of silicon oxide and aluminum oxide.

16. The display panel according to claim 12, wherein a thickness of the oxygenating layer ranges from 5 nm to 50 nm.

\* \* \* \* \*